US012666921B2

(12) United States Patent　　(10) Patent No.:　US 12,666,921 B2
Okubo et al.　　(45) Date of Patent:　Jun. 23, 2026

(54) PROCESSING APPARATUS USING LASER, METHOD OF LASER LIFT-OFF AND METHOD OF MANUFACTURING SEMICONDUCTOR DEVICE

(71) Applicant: Kioxia Corporation, Minato-ku (JP)

(72) Inventors: Takuro Okubo, Yokkaichi (JP); Hidekazu Hayashi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 445 days.

(21) Appl. No.: 18/332,508

(22) Filed: Jun. 9, 2023

(65) Prior Publication Data

US 2024/0096682 A1　　Mar. 21, 2024

(30) Foreign Application Priority Data

Sep. 16, 2022　(JP) ................................. 2022-147672

(51) Int. Cl.
| | |
|---|---|
| *H01L 21/68* | (2006.01) |
| *B23K 26/073* | (2006.01) |
| *B23K 26/08* | (2014.01) |
| *B23K 26/18* | (2006.01) |
| *H10P 72/70* | (2026.01) |
| *B23K 101/40* | (2006.01) |
| *H10B 80/00* | (2023.01) |
| *H10W 90/00* | (2026.01) |

(52) U.S. Cl.
CPC .......... *H10P 72/74* (2026.01); *B23K 26/0734* (2013.01); *B23K 26/0823* (2013.01); *B23K 26/0869* (2013.01); *B23K 26/18* (2013.01); *B23K 2101/40* (2018.08); *H10B 80/00*

(2023.02); *H10P 72/7442* (2026.01); *H10W 90/00* (2026.01); *H10W 90/792* (2026.01)

(58) Field of Classification Search
CPC . H01L 21/6835; H01L 24/08; H01L 25/0657; H01L 2221/68386; H01L 2224/08145; H01L 2924/1438; H01L 2221/68318; H01L 2221/68381; B23K 26/0734; B23K 26/0823; B23K 26/0869; B23K 26/18; B23K 2101/40; B23K 26/57; H10B 80/00
USPC ........................................................ 438/106
See application file for complete search history.

(56) References Cited

U.S. PATENT DOCUMENTS

| | | | | |
|---|---|---|---|---|
| 9,111,983 | B1 * | 8/2015 | Ginter ................... | H01L 21/768 |
| 9,269,561 | B2 * | 2/2016 | Dang ................. | H01L 21/02002 |

(Continued)

FOREIGN PATENT DOCUMENTS

| | | |
|---|---|---|
| JP | 2018066938 A | 4/2018 |
| JP | 2018093021 A | 6/2018 |

(Continued)

*Primary Examiner* — Vu A Vu
(74) *Attorney, Agent, or Firm* — Holtz, Holtz & Volek PC

(57)　　ABSTRACT

A processing apparatus using laser according to an embodiment includes a stage configured to hold a substrate and rotate, and a laser irradiation apparatus capable of moving in a radial direction of the rotation. The laser irradiation apparatus includes a control unit configured to control an output of an infrared pulsed laser so that L1/L2 satisfies 1.2 or more and 10 or less when a distance between laser spots adjacent to each other in a rotation direction of the stage is L1 and a distance between laser spots adjacent to each other in the radial direction of the rotation is L2.

13 Claims, 7 Drawing Sheets

300

(56)  References Cited

U.S. PATENT DOCUMENTS

|  |  |  |  |  |
|---|---|---|---|---|
| 9,586,291 B2 * | 3/2017 | Dang | ................. | G01R 31/2607 |
| 10,118,250 B1 * | 11/2018 | Budd | .................... | G01B 11/26 |
| 10,224,229 B2 * | 3/2019 | Andry | ................ | H01L 21/6835 |
| 10,586,726 B2 * | 3/2020 | Andry | .................... | H01L 21/78 |
| 2012/0231228 A1 | 9/2012 | Fujimori et al. |  |  |
| 2018/0315657 A1 | 11/2018 | Ikeno et al. |  |  |
| 2021/0242027 A1 | 8/2021 | Kohama et al. |  |  |
| 2021/0296119 A1 | 9/2021 | Tanoue et al. |  |  |
| 2022/0084868 A1 | 3/2022 | Nakao |  |  |
| 2022/0168850 A1 | 6/2022 | Yamashita |  |  |
| 2022/0314373 A1 | 10/2022 | Mori et al. |  |  |
| 2023/0108557 A1 | 4/2023 | Tanoue et al. |  |  |
| 2024/0044806 A1 * | 2/2024 | Kanai | .................... | G01N 21/94 |

FOREIGN PATENT DOCUMENTS

|  |  |  |  |
|---|---|---|---|
| JP | 2018183801 | A | 11/2018 |
| JP | 2022049603 | A | 3/2022 |
| JP | 2022091504 | A | 6/2022 |
| TW | 201344960 | A | 11/2013 |
| TW | 202106428 | A | 2/2021 |
| TW | 202141589 | A | 11/2021 |
| WO | 2011068111 | A1 | 6/2011 |
| WO | 2019044588 | A1 | 3/2019 |
| WO | 2019239892 | A1 | 12/2019 |
| WO | 2020017599 | A1 | 1/2020 |
| WO | 2020054504 | A1 | 3/2020 |
| WO | 2020066492 | A1 | 4/2020 |
| WO | 2020195567 | A1 | 10/2020 |
| WO | 2020213352 | A1 | 10/2020 |

* cited by examiner

<u>1</u>

PROCESSING APPARATUS USING LASER, METHOD OF LASER LIFT-OFF AND METHOD OF MANUFACTURING SEMICONDUCTOR DEVICE

CROSS REFERENCE TO RELATED APPLICATION(S)

This application is based upon and claims the benefit of priority from the prior Japanese Patent Application JP2022-147672, filed on Sep. 16, 2022, the entire contents of which are incorporated herein by reference.

FIELD

Embodiment described herein relate generally to a processing apparatus using laser, a method of laser lift-off, and a method of manufacturing a semiconductor device.

BACKGROUND

A NAND flash memory is known as a semiconductor memory device. The NAND flash memory includes a memory cell array and its control circuit. As a method of manufacturing a semiconductor memory device, a method is known in which a memory cell array chip and a control circuit chip are formed on the separate substrates and then bonded to each other later. In this case, the substrate on which the memory cell array chip is formed can be reused by laser peeling.

DESCRIPTION OF EMBODIMENTS

Figure 1:
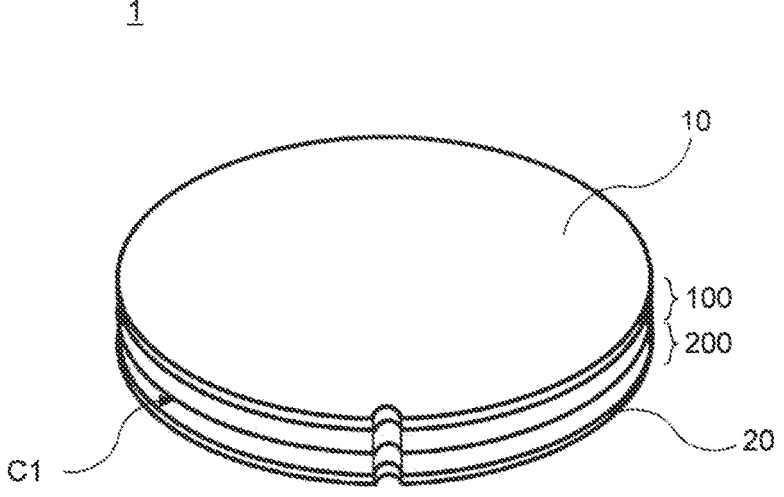
FIG. 1 is a diagram showing an entire configuration of a semiconductor memory device (bonded substrate) according to the present embodiment.

Hereinafter, a processing apparatus using laser, a method of laser lift-off, and a method of manufacturing a semiconductor device according to the present embodiment will be described in detail referring to the drawings. In the following description, elements having substantially the same functions and configurations are denoted by the same symbols or with the same symbols followed by the addition of an alphabet and will be described in duplicate only when necessary. Each of the embodiments described below exemplifies an apparatus and a method for embodying a technical idea of this embodiment. Various modifications may be made in the embodiment without departing from the gist of the invention. These embodiments and modifications thereof are included in the scope of the invention described in the claims and the equivalents.

For the sake of clarity, although the drawings may be schematically represented with respect to the widths, thicknesses, shapes, and the like of the respective portions compared with actual embodiments, they are merely examples and do not limit the interpretation of the present invention. In the present specification and each drawing, elements having the same functions as those described with reference to the preceding drawings are denoted by the same symbols, and a repetitive description thereof may be omitted.

In each embodiment, a direction from each substrate toward the memory cells or control circuits is referred to as above. On the contrary, a direction from the memory cell or control circuit to each substrate is referred to as below. As described above, for convenience of explanation, the phrase "above" or "below" is used for explanation, for example, the substrate and the memory cell may be arranged so that the vertical relationship thereof is opposite to that shown in the drawing. In the following description, for example, the expression "the memory cell on the substrate" merely describes the vertical relation between the substrate and the memory cell as described above, and other members may be arranged between the substrate and the memory cell.

The expression "a includes A, B, or C" in this specification does not exclude the case where a includes multiple combinations of A to C unless otherwise specified. Furthermore, this expression does not exclude the case where a includes other elements.

The following embodiments can be combined with each other as long as there is no technical contradiction.

A processing apparatus using laser according to the present embodiment includes a stage configured to hold a substrate and rotate, and a laser irradiation apparatus capable of moving in a radial direction of the rotation. The laser irradiation apparatus includes a control unit configured to control an output of an infrared pulsed laser so that L1/L2 satisfies 1.2 or more and 10 or less when a distance between laser spots adjacent to each other in a rotation direction of the stage is L1 and a distance between laser spots adjacent to each other in the radial direction of the rotation is L2.

First Embodiment

[Semiconductor Memory Device (Bonded Substrate)]

Figure 2:
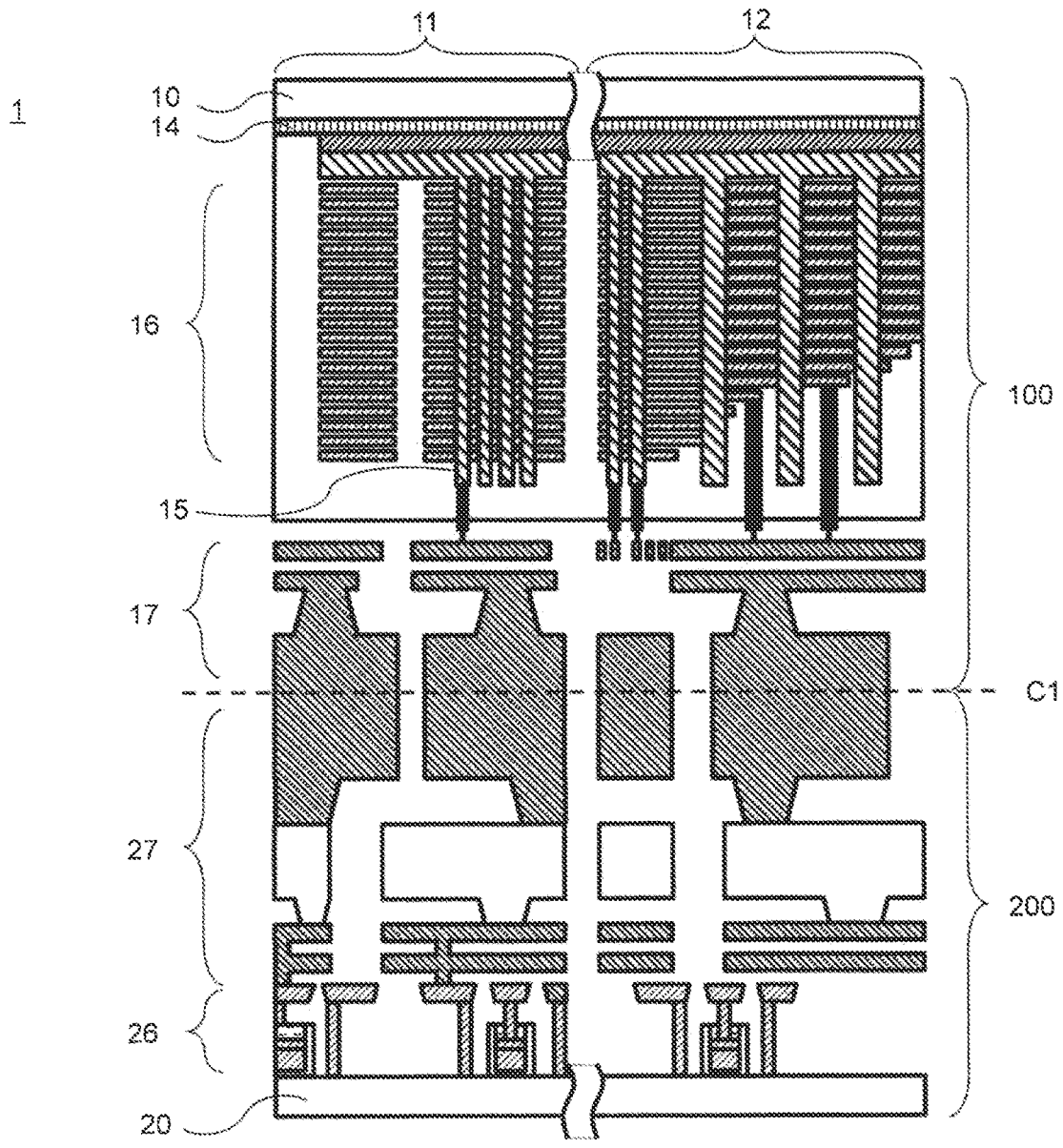
FIG. 2 is a cross-sectional view showing a configuration of a semiconductor memory device (bonded substrate) according to the present embodiment.
Figure 3:
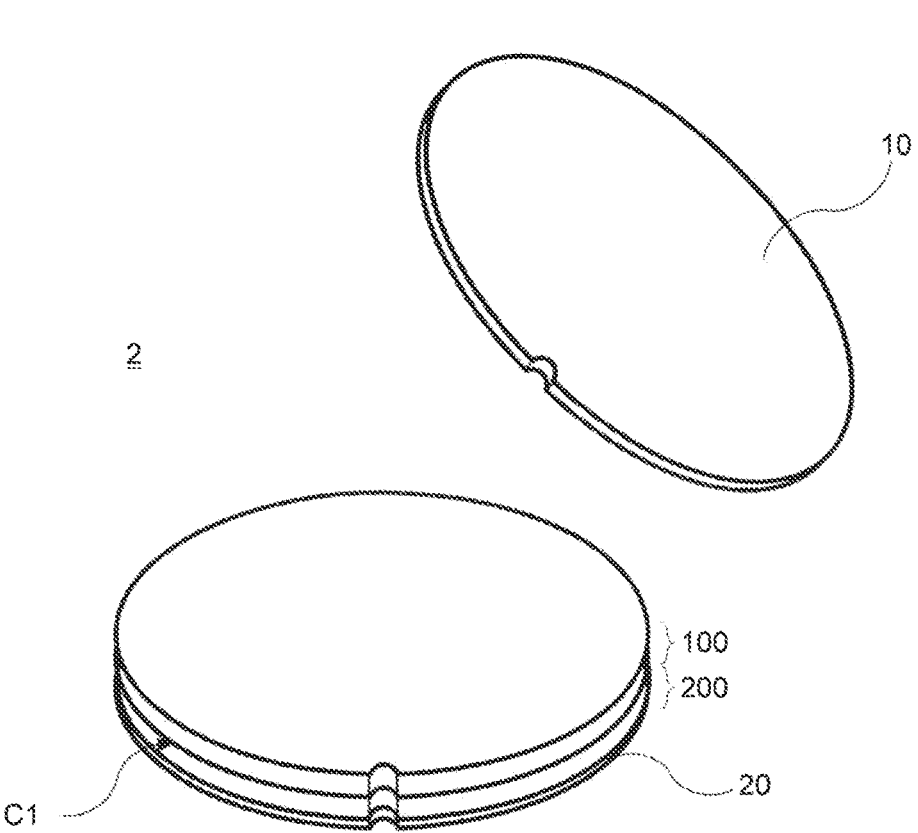
FIG. 3 is a diagram showing an entire configuration of a semiconductor memory device according to the present embodiment.

A configuration of a semiconductor memory device (bonded substrate) 1 according to the present embodiment will be described with reference to FIG. 1 to FIG. 3. FIG. 1 is a diagram showing an entire configuration of the semiconductor memory device (bonded substrate) 1. FIG. 2 is a cross-sectional view showing a basic configuration of the semiconductor memory device (bonded substrate) 1. FIG. 3 is a diagram showing an entire configuration of a semiconductor memory device 2. As shown in FIG. 1, the semiconductor memory device (bonded substrate) 1 includes a memory cell array chip 100 as a first circuit layer and a control circuit (CMOS circuit) chip 200 as a second circuit layer. The memory cell array chip 100 and the control circuit chip 200 are connected by a connecting surface C1. In addition, the first circuit layer and the second circuit layer are not particularly limited. Therefore, the semiconductor memory device of the embodiment may be referred to as a "semiconductor device".

[Structure of Memory Cell Array Chip]

As shown in FIG. 2, the memory cell array chip 100 includes a substrate 10, a laser absorption layer 14, a plurality of electrode layers 16, a plurality of semiconductor pillars 15, and a memory-side wiring layer 17. The plurality of electrode layers 16 is alternately stacked with a plurality of insulating layers on the substrate 10 via the laser absorption layer 14. Each of the semiconductor pillars 15 is arranged to penetrate through the plurality of stacked electrode layers 16 in the direction perpendicular to the substrate 10. Each of the semiconductor pillars 15 is combined with the plurality of electrode layers 16 via the insulating layer to function as a plurality of transistors including memory cells. That is, in a memory cell array area 11 (upper left portion in FIG. 2), the plurality of transistors including memory cells is three-dimensionally arranged. The semiconductor pillar 15 is electrically connected to a source line at one end (the substrate 10 side) and to the memory-side wiring layer 17 at the other end (opposite to the substrate 10 side). A connecting terminal for connecting with the control circuit chip 200 is arranged on the connecting surface C1 opposite to the substrate 10 of the memory-side wiring layer 17.

A drawing area 12 (upper right portion in FIG. 2) is arranged on the substrate 10 along with the memory cell array area 11. In the drawing area 12, terminal portions of the plurality of electrode layers 16 are pulled out in a staircase pattern, respectively. Each terminal portion is connected to wirings arranged in the vertical direction through a contact hole opened in the insulating film. These wirings arranged in the vertical direction are electrically connected to the memory-side wiring layer 17 and are connected to the control circuit chip 200 via the connecting terminal.

The substrate 10 may be a semiconductor wafer such as a silicone substrate, or a glass substrate. The laser absorption layer 14 is arranged between the substrate 10 and the plurality of electrode layers 16. As shown in FIG. 3, the substrate 10 and the laser absorption layer 14 of the semiconductor memory device (bonded substrate) 1 according to the present embodiment are finally removed from the semiconductor memory device 2 by irradiating the laser absorption layer 14 with a laser in a manufacturing process of the semiconductor memory device. The laser absorption layer 14 is preferably, for example, a silicon oxide film. The semiconductor memory device 2 may be a semiconductor chip by individualized after removing the substrate 10 and the laser absorption layer 14. The substrate 10 peeled off by a laser processing may be reused.

[Structure of Control Circuit Chip]

As shown in FIG. 2, the control circuit chip 200 includes a substrate 20, a plurality of transistors 26 constituting a control circuit, and a circuit-side wiring layer 27. The plurality of transistors 26 is formed on the substrate 20 and electrically connected to the circuit-side wiring layer 27 on the opposite side of the substrate 20. A connecting terminal for connecting to the memory cell array chip 100 is arranged on the connecting surface C1 of the circuit-side wiring layer 27 opposed to the substrate 20. The substrate 20 may be a semiconductor wafer such as a silicon substrate.

[Processing Apparatus Using Laser Using Laser]

A processing apparatus using laser 300 according to the present embodiment will be described with reference to FIG. 4 and FIG. 5.

Figure 4:
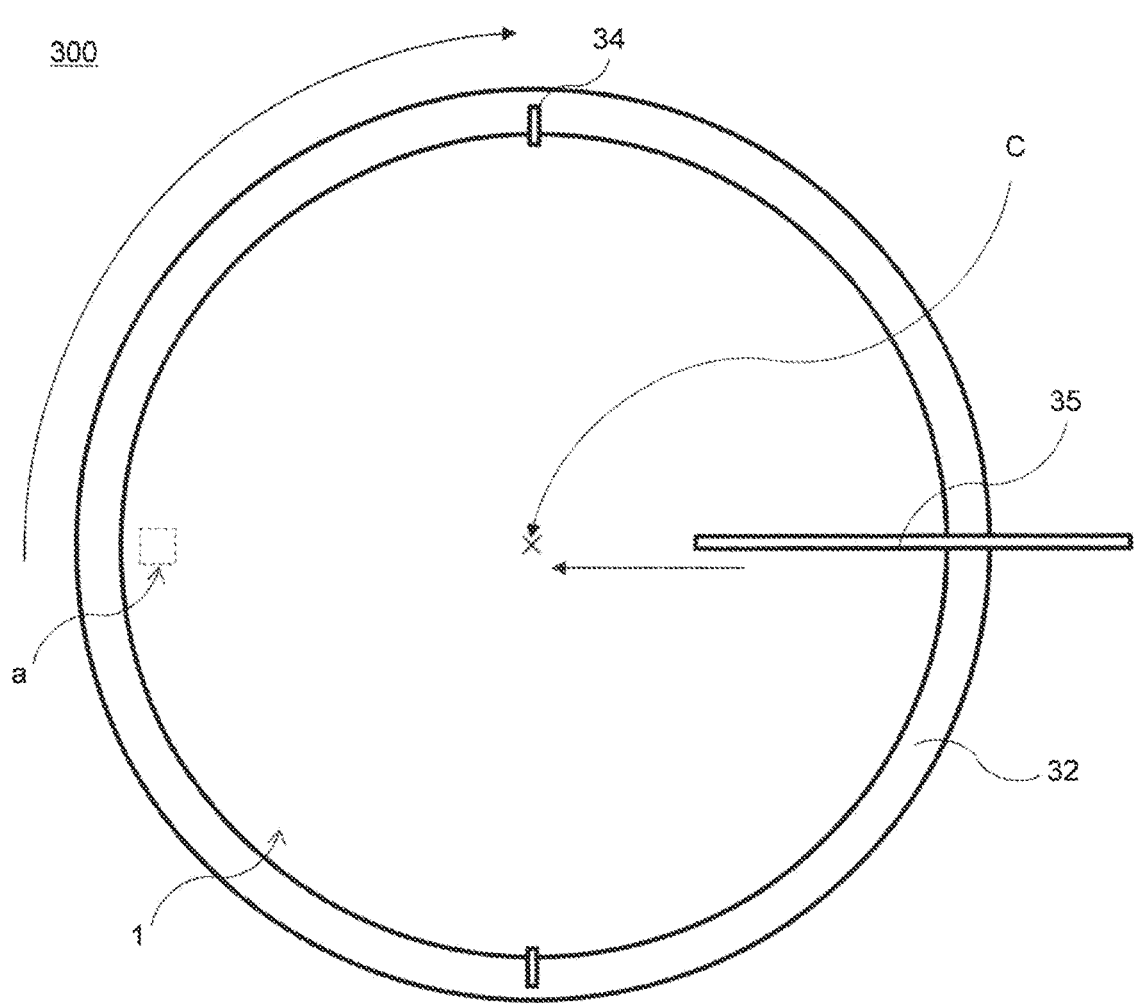
FIG. 4 is a top view showing a basic configuration of a processing apparatus using laser according to the present embodiment.

FIG. 4 is a top view showing a basic configuration of a processing apparatus using laser. FIG. 5 is a side view showing a basic configuration of a processing apparatus using laser. As shown in FIG. 4 and FIG. 5, the processing apparatus using laser 300 includes a stage 32 and a laser irradiation apparatus 35.

The stage 32 is circular and configured to hold a wafer-state (disk-shaped) semiconductor memory device (bonded substrate) 1. The center of the semiconductor memory device (bonded substrate) 1 is preferably arranged at a center C of the stage 32. The semiconductor memory device (bonded substrate) 1 is arranged so that the substrate 20 is arranged on a lower side (the stage 32 side) and the substrate 10 is arranged on an upper side (opposite to the stage 32 side).

The stage 32 includes a rotating mechanism 33 and a control unit 39. The stage 32 rotates around a vertical axis including the center C by the rotating mechanism 33. In FIG. 4, although a direction (arrow) in which the stage 32 rotates clockwise is shown, the stage may rotate counterclockwise. As the stage 32 rotates, the semiconductor memory device (bonded substrate) 1 held by the stage 32 rotates around the center C. The rotational operation and rotation speed of the stage 32 driven by the rotating mechanism 33 are controlled by the control unit 39.

The stage 32 may include a holding mechanism 34. The holding mechanism 34 can hold the substrate 10, which is peeled from the semiconductor memory device (bonded substrate) 1 by laser processing, on the stage 32. In FIG. 4, two holding mechanisms 34 are arranged at an end portion of the semiconductor memory device (bonded substrate) 1. However, the number and location of the holding mechanisms 34 per one semiconductor memory device (bonded substrate) 1 are not particularly limited. It is sufficient that the holding mechanism 34 does not interfere with the laser processing and can recover the peeled substrate 10. The substrate 10 collected without damage by the holding mechanism 34 can be reused.

The laser irradiation apparatus 35 is arranged above the stage 32. The laser irradiation apparatus 35 irradiates the laser absorption layer 14 of the semiconductor memory device (bonded substrate) 1 with a laser. The laser irradiation apparatus 35 irradiates a high-frequency pulsed laser that is oscillated from a laser oscillator (not shown). The laser is transparent to the substrate 10. Therefore, irradiating the laser from the substrate 10 side of the semiconductor memory device (bonded substrate) 1 makes it possible to focus and irradiate on the laser absorption layer 14 located below the substrate 10. The laser is preferably, for example, an infrared pulsed laser, and preferably, a carbon dioxide gas laser ($CO_2$ laser). Laser irradiation causes ablation of the laser absorption layer 14.

The laser irradiation apparatus 35 includes a moving mechanism 36 and a control unit 38. The laser irradiation apparatus 35 moves in the radial direction above the stage 32 by the moving mechanism 36. In FIG. 4 and FIG. 5, although a direction (arrow) in which the laser irradiation apparatus 35 moves toward the center C from the end portion of the stage 32 is shown, the laser irradiation apparatus 35 may move toward the end portion from the center C of the stage 32. The laser irradiation apparatus 35 can move at least from the end to the center (range of radius) of the semiconductor memory device (bonded substrate) 1. As the laser irradiation apparatus 35 moves while the stage 32 rotates, the laser irradiation apparatus 35 irradiates the stage 32 with a laser along a spiral orbit. That is, the laser irradiation apparatus 35 irradiates the semiconductor memory device (bonded substrate) 1 arranged on the stage 32 with a laser along a spiral orbit. The moving operation and moving velocity of the laser irradiation apparatus 35 driven by the moving mechanism 36 and the laser output of the laser irradiation apparatus 35 are controlled by the control unit 38.

[Method of Laser Lift-Off]

A method of laser lift-off for removing the substrate 10 and the laser absorption layer 14 from the semiconductor memory device (bonded substrate) 1 using the processing apparatus using laser 300 according to the present embodiment will be described. The semiconductor memory device (semiconductor device) of the embodiment is manufactured using a method of laser lift-off described below.

Figure 5:
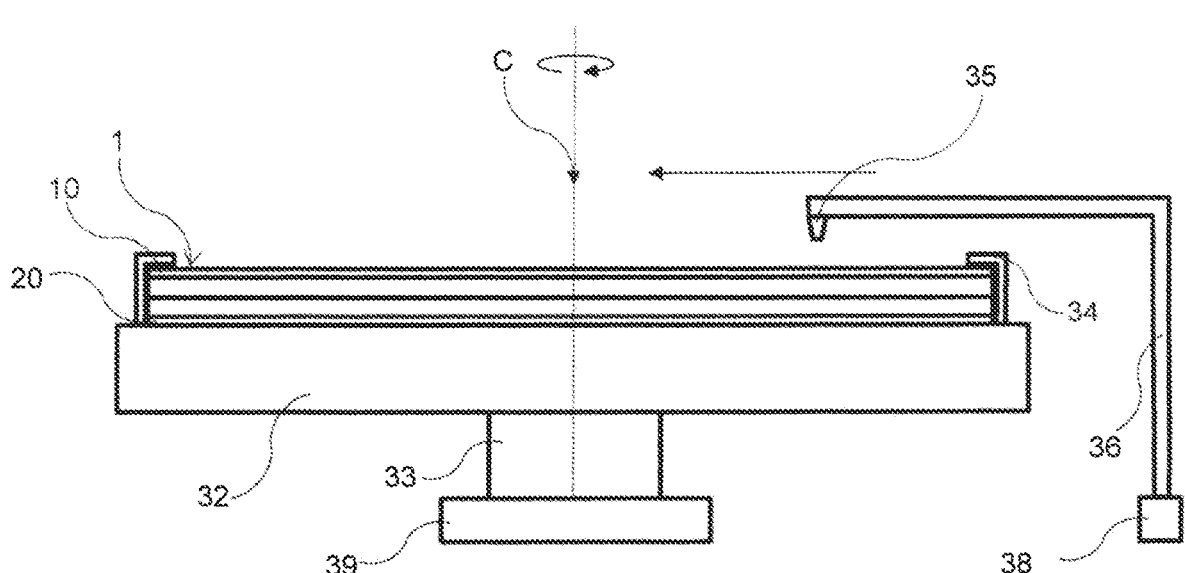
FIG. 5 is a side view showing a basic configuration of a processing apparatus using laser according to the present embodiment.

As shown in FIG. 4 and FIG. 5, the semiconductor memory device (bonded substrate) 1 is arranged so that the substrate 20 is arranged on the lower side (the stage 32 side) and the substrate 10 is arranged on the upper side (opposite to the stage 32 side). The laser irradiation apparatus 35 irradiates the stage 32 with a laser along a spiral orbit by moving the laser irradiation apparatus 35 while rotating the stage 32. The laser is focused and irradiated on the laser absorption layer 14 of the semiconductor memory device (bonded substrate) 1. The laser irradiation apparatus 35 moves at least from the end to the center (range of radius) of the semiconductor memory device (bonded substrate) 1.

Figure 6:
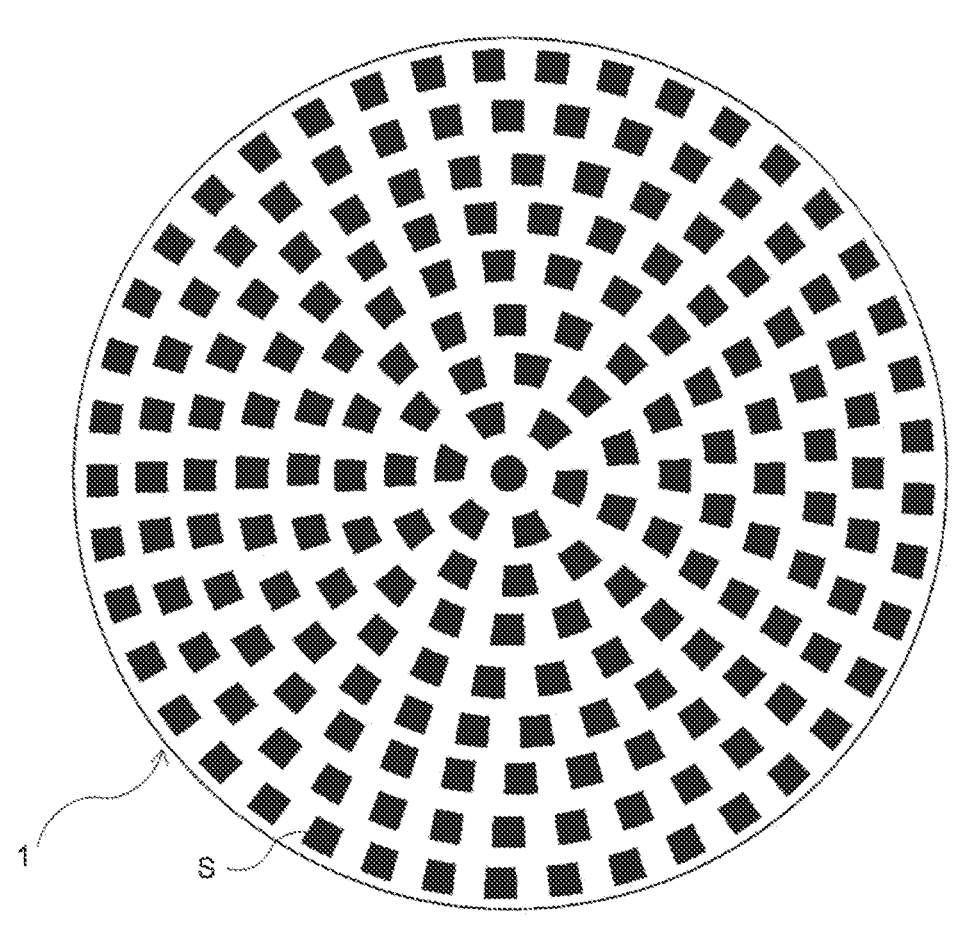
FIG. 6 is a top view showing a laser irradiation area (laser spot) of a semiconductor memory device (bonded substrate) 1 according to the present embodiment.
Figure 7:
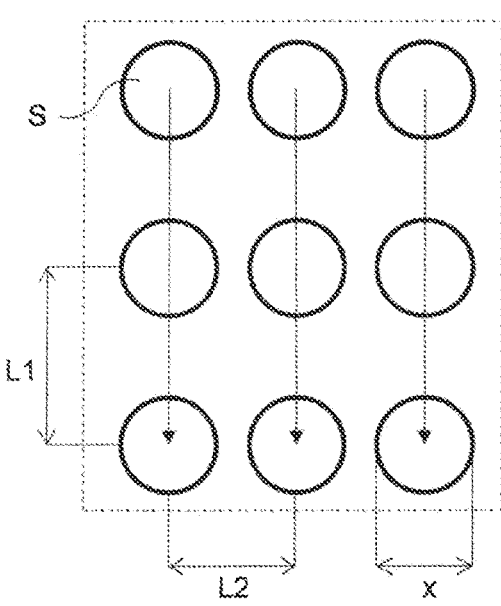
FIG. 7 is an enlarged top view showing the laser irradiation area (laser spot) of the semiconductor memory device (bonded substrate) 1 according to the present embodiment.

FIG. 6 is a top view showing a laser irradiation area of the semiconductor memory device (bonded substrate) 1. FIG. 7 is an enlarged top view showing the laser irradiation area of the semiconductor memory device (bonded substrate) 1. FIG. 7 is an enlarged top view at the top surface of the laser absorption layer 14 of FIG. 2 (area a of FIG. 4). As the stage 32 rotates, a laser spot S, which is continuously irradiated, moves in a direction (arrow) opposite to the rotation direction of the stage 32. That is, the two laser spots S, which are continuously irradiated, are adjacent to each other in the rotation direction of the stage 32. An interval L1 between the two laser spots S, which are continuously irradiated, is a linear velocity/frequency of the pulsed laser. The interval L1 between the two laser spots S indicates a distance between the centers of the two laser spots S. The linear velocity of the pulsed laser is the moving velocity (rotation speed) of the stage 32 at the position of the laser irradiation apparatus 35 and controlled by the control unit 39. The position of the laser irradiation apparatus 35 and the frequency of the pulsed laser are controlled by the control unit 38.

In the present embodiment, for example, the interval L1 between the two laser spots S, which are continuously irradiated, may be larger than a diameter x of the laser spot S (L1>x). That is, the two laser spots S adjacent to each other in the rotational direction of the stage 32 may be separated (L1–x). The diameter x of the laser spot S indicates the full width at half maximum of the laser spot S on the top surface of the laser absorption layer 14. For example, the diameter x of the laser spot S may be defined by checking a laser mark. The diameter x of the laser spot is controlled by the control unit 38.

The interval L1 between the laser spots S is preferably substantially the same on substantially the entire surface of the substrate 10. That is, the interval L1 between the laser spots S is preferably substantially the same at the central portion of the substrate 10 and the outer peripheral portion outside of the central portion. Therefore, the closer the position of the laser irradiation apparatus 35 to the center C, the rotation speed of the stage 32 is preferably increased. The closer the position of the laser irradiation apparatus 35 to the center C, the frequency of the pulsed laser is preferably reduced (increase the period of the pulse).

While the stage 32 rotates approximately once, the laser irradiation apparatus 35 moves toward the center C. That is, the lap-delayed the laser spot S is adjacent to the previous laser spot S in the radial direction of the stage 32. An interval L2 between the two laser spots S adjacent to a moving direction of the laser irradiation apparatus 35 is a moving distance of the laser irradiation apparatus 35 while the stage 32 rotates once. The interval L2 between the two laser spots S indicates a distance between the centers of the two laser spots S. The moving distance of the laser irradiation apparatus 35 while the stage 32 rotates once is controlled by the control unit 38 according to the moving velocity of the laser irradiation apparatus 35.

In the present embodiment, for example, the interval L2 between the two laser spots S adjacent to each other in the moving direction of the laser irradiation apparatus 35 may be larger than the diameter x of the laser spot S (L2>x). That is, the two laser spots S adjacent to each other in the radial direction of the stage 32 may be separated (L2–x).

The interval L2 between the laser spots S is preferably substantially the same on substantially the entire surface of the substrate 10. That is, the interval L2 between the laser spots S is preferably substantially the same at the central portion of the substrate 10 and the outer peripheral portion outside of the central portion. Therefore, the moving velocity of the laser irradiation apparatus 35 is preferably constant. However, it is not limited thereto, in the case where the rotation speed of the stage 32 is increased to make the interval L1 between the laser spots S constant, the moving velocity of the laser irradiation apparatus 35 may be increased.

In the present embodiment, the interval L1 between the two laser spots S, which are continuously irradiated, is larger than the interval L2 between the two laser spots S adjacent to each other in the moving direction of the laser irradiation apparatus 35 (L1>L2). The interval L1 between the two laser spots S, which are continuously irradiated, is preferably 1.2 times or more and 10 times or less than the interval L2 between the two laser spots S adjacent to each other in the moving direction of the laser irradiation apparatus 35 (1.2<L1/L2<10). If the interval L1 between the two laser spots S, which are continuously irradiated, is less than 1.2 times than the interval L2 between the two laser spots S adjacent to each other in the moving direction of the laser irradiation apparatus 35, the bonding of the laser absorption layer 14 between the two laser spots S adjacent to each other in the moving direction of the laser irradiation apparatus cannot be sufficiently reduced, and the peeling behavior of the laser absorption layer 14 becomes uneven when the substrate 10 is separated from the semiconductor memory device (bonded substrate) 1. If the interval L1 between the two laser spots S, which are continuously irradiated, is larger than 10 times than the interval L2 between the two laser spots S adjacent to each other in the moving direction of the laser irradiation apparatus 35, the manufacturing efficiency of the semiconductor memory device 2 is lowered. Further, it is more preferable that the interval L1 between the two laser spots S, which are continuously irradiated, is 1.2 times or more and 2.3 times or less than the interval L2 between the two laser spots S adjacent to each other in the moving direction of the laser irradiation apparatus 35 (1.2<L1/L2<2.3). The ratio (L1/L2) of the interval L1 between the laser spots S with respect to the interval L2 between the laser spots S on substantially the entire surface of the substrate is preferably constant. That is, the central portion of the substrate 10 and the outer peripheral portion outside of the central portion each satisfy 1.2<L1/L2<10, and more preferably satisfy 1.2<L1/L2<2.3.

In the method of laser lift-off according to the present embodiment, the intervals L1 and L2 between the laser spots S and the diameter x of the laser spot can be appropriately adjusted by controlling the rotation speed of the stage 32, the moving velocity of the laser irradiation apparatus 35, and the laser output (the frequency of the pulsed laser and the diameter of the laser spot) of the laser irradiation apparatus 35 of the processing apparatus using laser 300 by the control units 38 and 39. Controlling the intervals L1 and L2 of the laser spot S and the diameter x of the laser spot within the range described above makes it possible to suppress the effect of the heat storage of the two laser spots S, which are continuously irradiated, and the bonding force of the laser absorption layer 14 can be uniformly reduced so that the substrate 10 can be separated from the semiconductor memory device (bonded substrate) 1. Therefore, the method of laser lift-off according to the present embodiment can improve the manufacturing efficiency of the semiconductor memory device 2 and the reuse efficiency of the substrate 10.

In the present embodiment, the configuration in which the two control units 38 and 39 respectively control the rotation speed of the stage 32, the moving velocity of the laser irradiation apparatus 35, and the laser output (the frequency of the pulsed laser and the diameter of the laser spot) of the laser irradiation apparatus 35 of the processing apparatus using laser 300 is shown. However, it is not limited thereto, the rotation speed of the stage 32, the moving velocity of the laser irradiation apparatus 35, and the laser output (the frequency of the pulsed laser and the diameter of the laser spot) of the laser irradiation apparatus 35 of the processing apparatus using laser 300 may be integrally controlled by one control unit.

In addition, a configuration in which the laser irradiation apparatus 35 oscillates one laser beam is shown. However, it is not limited thereto, and the laser irradiation apparatus 35 may be configured to oscillate a plurality of laser beams. In this case, the plurality of laser beams may be arranged separated L2 to each other in the radial direction of the stage 32, and the plurality of laser beams may be arranged with a distance of the radius of the semiconductor memory device (bonded substrate) 1 in the radial direction of the stage 32. Controlling the intervals L1 and L2 between the laser spots S within the range described above makes it possible to irradiate the laser more efficiently.

What is claimed is:

1. A processing apparatus using a laser, the processor apparatus comprising:
   a stage configured to hold a substrate and rotate;
   a laser irradiation apparatus movable in a radial direction of rotation of the stage; and
   a moving mechanism configured to move the laser irradiation apparatus in the radial direction,
   wherein the laser irradiation apparatus includes a control unit configured to control an output of an infrared pulsed laser so that the following condition is satisfied:

$$1.2 \leq L1/L2 \leq 10$$

where L1 is a distance between laser spots adjacent to each other in a rotation direction of the stage, and L2 is a distance between laser spots adjacent to each other in the radial direction.

2. The processing apparatus using laser according to claim 1, wherein the condition $1.2 \leq L1/L2 \leq 10$ is satisfied at a central portion of the substrate and at a peripheral portion outside the central portion.

3. The processing apparatus using laser according to claim 1, wherein L1 corresponds to a linear velocity/frequency of the infrared pulsed laser.

4. The processing apparatus using laser according to claim 1, wherein the control unit controls a diameter and frequency of the laser spot.

5. The processing apparatus using laser according to claim 1, wherein the infrared pulsed laser includes a carbon dioxide gas laser.

6. A method of laser lift-off, the method comprising:
   arranging a bonded substrate on a stage, the bonded substrate being formed by bonding a first substrate and a second substrate via a laser absorption layer;
   rotating the stage; and
   moving the laser irradiation apparatus in a radial direction of rotation of the stage,
   wherein the laser irradiation apparatus is configured to irradiate the laser absorption layer with an infrared pulsed laser by controlling an output so that the following condition is satisfied:

$$1.2 \leq L1/L2 \leq 10$$

where L1 is a distance between laser spots adjacent to each other in the rotation direction of the stage, and L2 is a distance between laser spots adjacent to each other in the radial direction, and
   wherein L1 is greater than a diameter of each of the laser spots adjacent to each other in the rotation direction of the stage, and L2 is greater than a diameter of each of the laser spots adjacent to each other in the radial direction.

7. The method according to claim 6, wherein the laser irradiation apparatus controls the output of the infrared pulsed laser so that the condition $1.2 \leq L1/L2 \leq 10$ is satisfied at a central portion of the second substrate and at a peripheral portion outside the central portion.

8. The method according to claim 6, wherein L1 corresponds to a linear velocity/frequency of the infrared pulsed laser.

9. The method according to claim 6, wherein the laser irradiation apparatus controls a diameter and frequency of the laser spot.

10. The method according to claim 6, wherein the infrared pulsed laser includes a carbon dioxide gas laser.

11. A method of manufacturing a semiconductor device, the method comprising:
   arranging a bonded substrate on a stage, the bonded substrate being formed by bonding a first substrate and a second substrate via a laser absorption layer;
   rotating the stage;
   moving a laser irradiation apparatus in a radial direction of rotation of the stage, the laser irradiation apparatus being configured to irradiate the laser absorption layer with an infrared pulsed laser by controlling an output so that the following condition is satisfied:

$$1.2 \leq L1/L2 \leq 10$$

where L1 is a distance between laser spots adjacent to each other in the rotation direction of the stage, and L2 is a distance between laser spots adjacent to each other in the radial direction; and
   peeling off the second substrate from the first substrate,
   wherein L1 is greater than a diameter of each of the laser spots adjacent to each other in the rotation direction of the stage, and L2 is greater than a diameter of each of the laser spots adjacent to each other in the radial direction.

12. The method according to claim 11, wherein the laser absorption layer includes a silicon oxide film.

13. The method according to claim 11, wherein:

the bonded substrate includes a CMOS circuit, a memory cell array, and the laser absorption layer between the first substrate and the second substrate, and the laser irradiation apparatus irradiates the infrared pulsed laser from a second substrate side.

* * * * *